United States Patent [19]
Adriaenssens et al.

[11] Patent Number: 5,915,989
[45] Date of Patent: Jun. 29, 1999

[54] CONNECTOR WITH COUNTER-BALANCED CROSSWALK COMPENSATION SCHEME

[75] Inventors: Luc W. Adriaenssens, Red Bank; Amid I. Hashim, Randolph; William J. Ivan, Woodbridge; Troy P. Million, Sparta; Bryan S. Moffitt, Red Bank, all of N.J.

[73] Assignee: Lucent Technologies Inc., Murray Hill, N.J.

[21] Appl. No.: 08/922,942

[22] Filed: Sep. 3, 1997

Related U.S. Application Data

[63] Continuation-in-part of application No. 08/858,234, May 19, 1997, and a continuation-in-part of application No. 08/923,741, Sep. 2, 1997.

[51] Int. Cl.⁶ ........................................................ H01R 4/24
[52] U.S. Cl. .......................................................... 439/404
[58] Field of Search .................................. 439/404, 941, 439/676

[56] References Cited

U.S. PATENT DOCUMENTS

| | | | |
|---|---|---|---|
| 4,655,528 | 4/1987 | Groft | 439/404 |
| 5,226,835 | 7/1993 | Baker | 439/941 |
| 5,547,405 | 8/1996 | Pinney | 439/676 |
| 5,601,447 | 2/1997 | Reed | 439/404 |

*Primary Examiner*—Steven L. Stephan
*Assistant Examiner*—Javaid Nasri

[57] ABSTRACT

Connectors, such as 110-type patch plugs, are designed to reduce near-end crosstalk that is generated when the connector is mated to a corresponding receptacle, such as a 110-type connecting block. Connectors of the present invention employ a two-stage crosstalk compensation scheme in which a first stage induces a compensating crosstalk signal, having opposite polarity as the original crosstalk signal, while the second stage induces a counter-balancing crosstalk signal, having same polarity as the original crosstalk signal. The two-stage, counter-balanced crosstalk compensation scheme of the present invention takes into account both the magnitude of the original crosstalk signal as well as the phase differences between the original crosstalk signal and the compensating and counter-balancing crosstalk signals that result from the different locations along the signal path at which the crosstalk signals are induced. The contacts of the connector are designed such that the magnitudes and locations of the compensating and counter-balancing crosstalk signals provide effective crosstalk compensation over a particular range of frequencies, e.g., 1 MHz to 200 MHz.

13 Claims, 6 Drawing Sheets

CONNECTOR WITH COUNTER-BALANCED CROSSWALK COMPENSATION SCHEME

This is a continuation-in-part of U.S. patent application Ser. No. 08/858,234, filed May 19, 1997 as Baker 4-6-8-6, and of U.S. patent application Ser. No. 08/923,741, filed Sep. 2, 1997 as Adriaenssens 3-7-4-11-6, the teachings of both of which are incorporated herein by reference.

BACKGROUND OF THE INVENTION

1. Field of the Invention

The present invention relates to electrical connectors, and, in particular, to plugs designed to reduce crosstalk between adjacent transmission paths.

2. Description of the Related Art

One type of plug used to terminate cordage (i.e., multi-wire cabling) is the 110-type patch plug, manufactured by Lucent Technologies, Inc., of Murray Hill, N.J. One end of the 110-type patch plug permanently terminates a multi-wire cable, while the other end mates removably to the insulation displacement contacts (IDCs) of a 110-type connecting block, which is also manufactured by Lucent Technologies. 110-type patch plugs are often used in voice and data transmission applications. In such transmissions, a balanced signal transmission path is formed by each pair of conductors, called the TIP conductor and the RING conductor. A typical 8-wire cable can therefore support four different voice or data signal transmission paths.

A 110-type patch plug has one or more pairs of contacts (typically 1, 2, 3, or 4 pairs) that form the electrical connections between the conductors of a multi-wire cable and the IDCs of a 110-type connecting block. One end (i.e., the mating end) of each patch-plug contact is a blade that engages a split-beam contact of the 110-type connecting block. The other end (i.e., the cable end) of each patch-plug contact has a split-beam contact (e.g., an IDC) that terminates one of the cable conductors. The blades are sequenced in a linear alternating fashion between TIP and RING conductors in order to be aligned with the split-beam contacts of a 110-type connecting block.

FIGS. 1A–C shows perspective, top, and side views of the contacts of a prior art 110-type patch plug. The 110-type patch plug of FIGS. 1A–C has four pairs of contacts, with each TIP-RING pair ($T_i$, $R_i$) corresponding to a single balanced transmission path. Due to the proximity of the transmission paths within this 110-type patch plug, signals in one transmission path can induce near-end crosstalk in one or more adjacent transmission paths within the same plug.

Near-end crosstalk refers to unwanted signals induced in one transmission path due to signals that are transmitted over one or more other transmission paths appearing at the end nearest to where the transmitted signals are injected. Near-end crosstalk often occurs when the wires, contacts, and/or other conductors that form the various transmission paths are in close proximity to one another.

What is needed are patch plugs and other connectors that are designed to have low crosstalk between the transmission paths of multi-wire circuits. Previous attempts at reducing crosstalk have involved increasing the distance between transmission paths (i.e., from one pair of TIP-RING contacts to another) and/or decreasing the distance within each transmission path (i.e., between the two contacts of a single TIP-RING pair). Another approach is to introduce opposing crosstalk that is out of phase with the existing crosstalk. This is often done by designing a cross-over (i.e., a physical crossing of one contact over another) in one or more TIP-RING pairs, while possibly leaving other pairs of contacts without a cross-over. The patch plug of FIGS. 1A–C introduces opposing crosstalk by utilizing inductive coupling. These techniques work to some degree for low-frequency transmissions (e.g., less than 1 MHz), but do not provide satisfactory levels of crosstalk reduction for transmissions having relatively high frequencies.

SUMMARY OF THE INVENTION

The present invention is directed to connectors, such as 110-type patch plugs, that are designed to reduce near-end crosstalk that is generated when the connector is mated to a corresponding receptacle, such as a 110-type connecting block. According to the present invention, the connector employs a two-stage crosstalk compensation scheme in which a first stage induces a compensating crosstalk signal, having opposite polarity as the original crosstalk signal, while the second stage induces a counter-balancing crosstalk signal, having same polarity as the original crosstalk signal. The two-stage, counter-balanced crosstalk compensation scheme of the present invention takes into account both the magnitude of the original crosstalk signal as well as the phase differences between the original crosstalk signal and the compensating and counter-balancing crosstalk signals that result from the different locations along the signal path at which the crosstalk signals are induced. The contacts of the connector are designed such that the magnitudes and locations of the compensating and counter-balancing crosstalk signals provide effective crosstalk compensation over a particular range of frequencies, e.g., 1 MHz to 200 MHz.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1A:
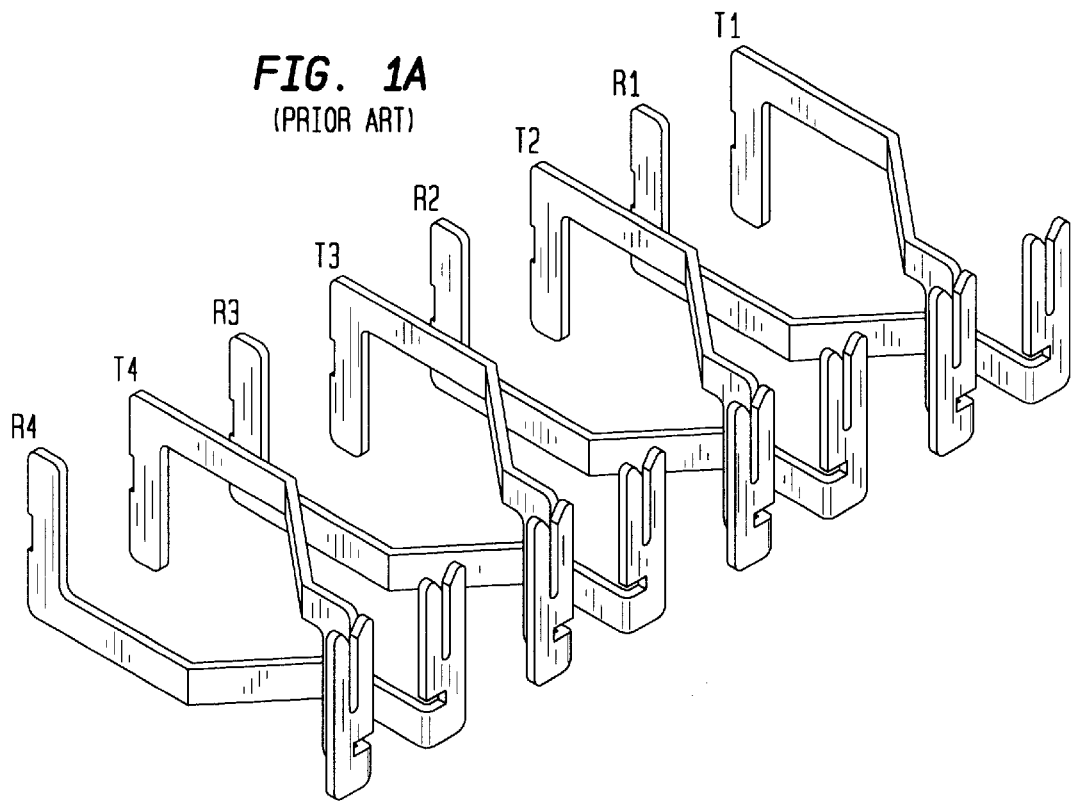
FIGS. 1A–C show perspective, top, and side views of the contacts of a prior-art 110-type patch plug.

When a signal is applied to a TIP-RING pair of contacts, a certain amount of crosstalk is generated in an idle adjacent TIP-RING pair in the mating plug blades and in the contacts of a 110-type connecting block. This crosstalk results from (a) capacitance between the driven pair and the idle pair caused by unlike-contact proximity between two pairs of contacts (e.g., R1 near T2) as well as (b) inductive coupling caused by adjacent electromagnetic loops that exist within these pairs.

The present invention uses a two-stage, counter-balanced compensation scheme to reduce this crosstalk. The first stage of the compensation scheme introduces a compensating or opposing crosstalk (i.e., has opposite polarity as the original crosstalk) at one point along the length of the patch plug, while the second stage of the compensation scheme introduces a counter-balancing or aiding crosstalk (i.e., has same polarity as the original crosstalk) at a second point along the length of the patch plug. Thus, the compensating crosstalk signal opposes the original crosstalk signal, and the counter-balancing crosstalk signal opposes the compensating crosstalk signal.

According to the present invention, the conductive structures, used to connect the mating-end blades at one end of the patch plug to the cable-end IDCs at the other end of the patch plug, have features that introduce capacitive and inductive couplings at these two different points along the length of the patch plug that will result in improved reduction of the crosstalk generated in the mated connection of the patch-plug blades and the split-beam contacts of a 110-type connecting block.

The first-stage, compensating crosstalk is preferably about twice the magnitude of the original crosstalk and preferably deployed about midway between the estimated site of the original crosstalk and the cable-end of the patch plug, which is the location of the second-stage, counter-balancing crosstalk. The compensating crosstalk is achieved (1) capacitively by proximity of the components of the patch-plug contacts and (2) inductively by the electromagnetic loops formed within each of the pairs of contacts. The site of application of this first-stage, compensating crosstalk is determined by the point where different contact components are joined and by the centroid of the area formed by the electro-magnetic loops. The second-stage compensation is a counter-balancing crosstalk preferably equal in magnitude to the original crosstalk and deployed at the cable-end of the patch plug. This counter-balancing crosstalk is achieved capacitively by the proximity of unlike type cable-connecting contacts (e.g., IDCs) in adjacent TIP-RING pairs as well as inductively by the side by side loops formed within the pairs at the cable-end of the patch plug.

The capacitance component of crosstalk also generates a common-mode signal in adjacent pairs that is in addition to the crosstalk. This common-mode component is nearly canceled by adding capacitance in the patch plug between two non-adjacent conductors, one from each of two adjacent pairs corresponding to the two conductors that are most distantly spaced from each other in the plug-mating blades. As described below, this capacitance is achieved by the proximity of components of one conductor in a TIP-RING pair to components of an unlike conductor of an adjacent TIP-RING pair.

Figure 2:
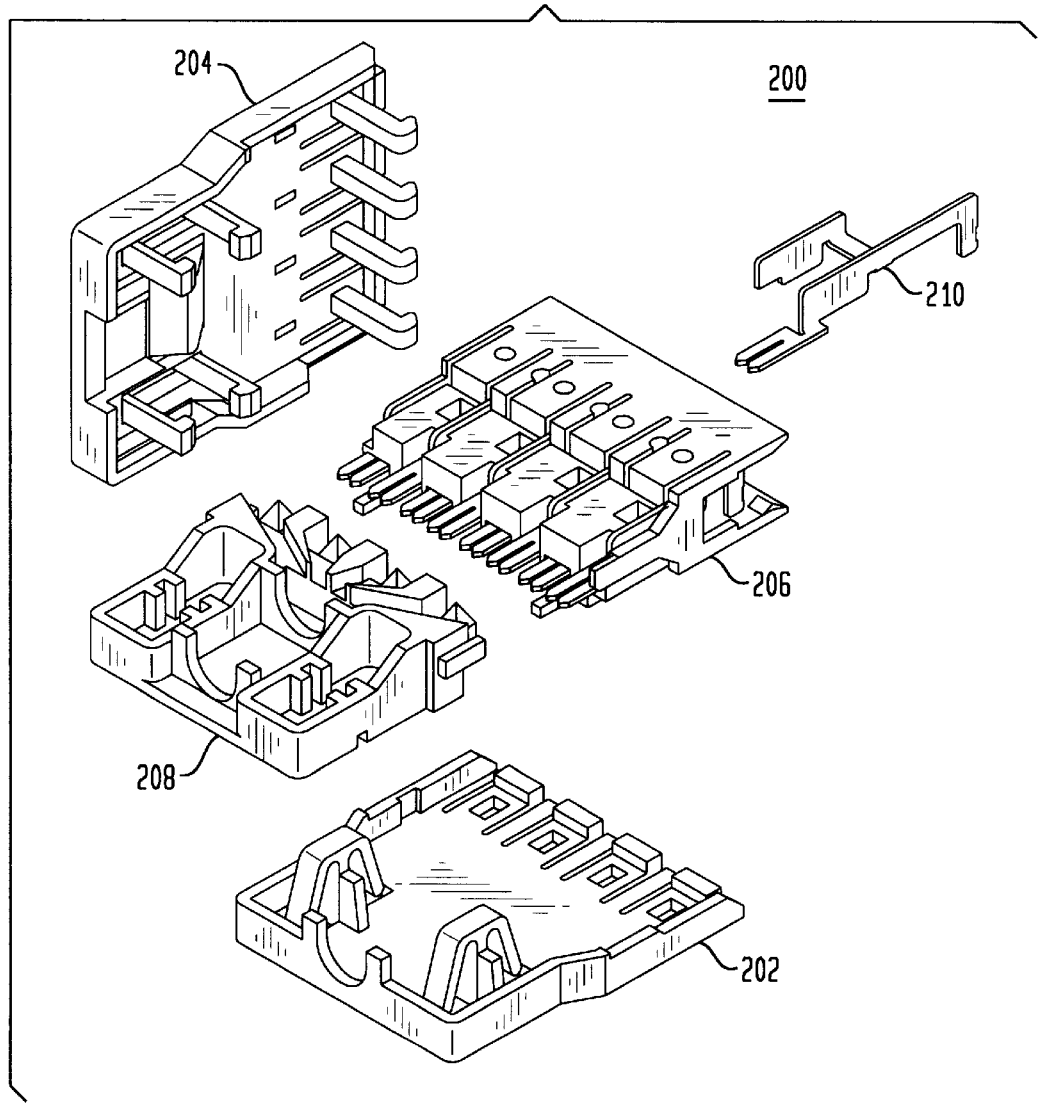
FIGS. 2 and 3 show exploded and assembled perspective views of a patch plug, according to one embodiment of the present invention.
Figure 3:
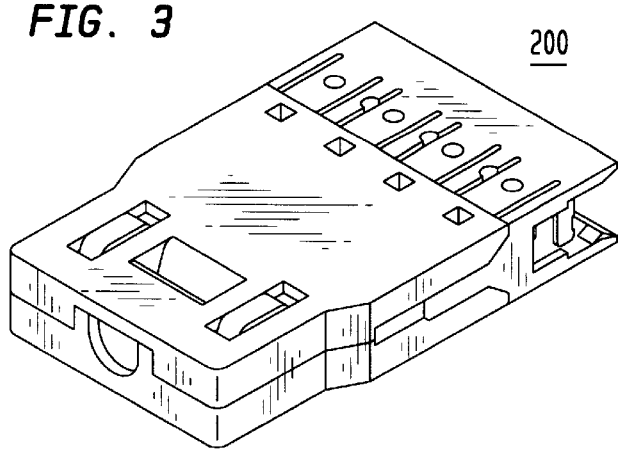

FIGS. 2 and 3 show exploded and assembled perspective views of a patch plug 200, according to one embodiment of the present invention. Patch plug 200 comprises a bottom cover 202, a top cover 204, a contact base 206, a wire guide 208, and four pairs of contacts 210 (only one shown in FIG. 2). Covers 202 and 204, base 206, and guide 208 are preferably made from a non-conducting plastic, such as polycarbonate, ABS, or PVC, while contacts 210 are made from a conducting material, such as phosphor bronze plated with nickel and gold. Patch plug 200 is designed to terminate cordage having four twisted pairs and to mate with a 110-type connecting block. In general, the present invention can be implemented as patch plugs designed to terminate cordage having one or more twisted pairs.

Figure 4:
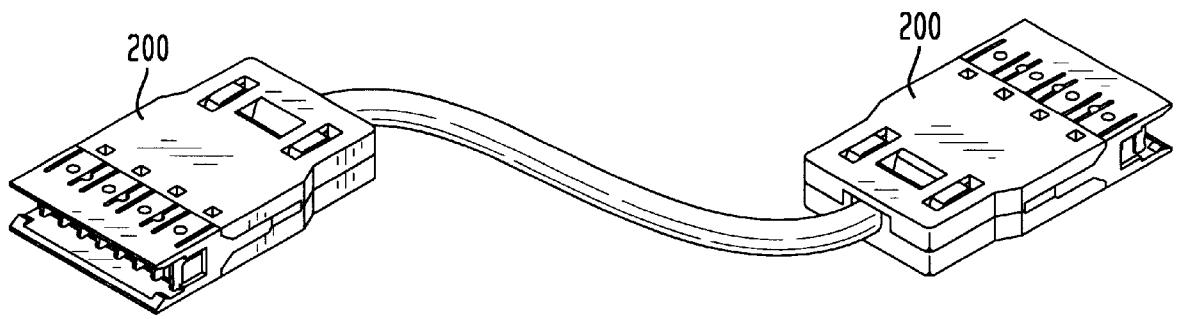
FIG. 4 shows a perspective view of cordage terminated at both ends by patch plugs similar to the patch plug of FIG. 2.
Figure 5:
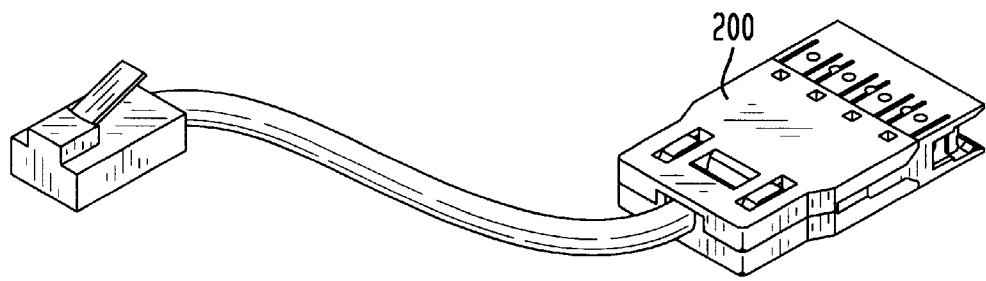
FIG. 5 shows a perspective view of cordage terminated, at one end, by a patch plug similar to the patch plug of FIG. 2 and, at the other end, by a conventional modular plug.

FIG. 4 shows a perspective view of cordage terminated at both ends by patch plugs similar to patch plug 200 of FIG. 2. Similarly, FIG. 5 shows a perspective view of cordage terminated, at one end, by a patch plug similar to patch plug 200 of FIG. 2 and, at the other end, by a conventional modular plug.

Figure 6:
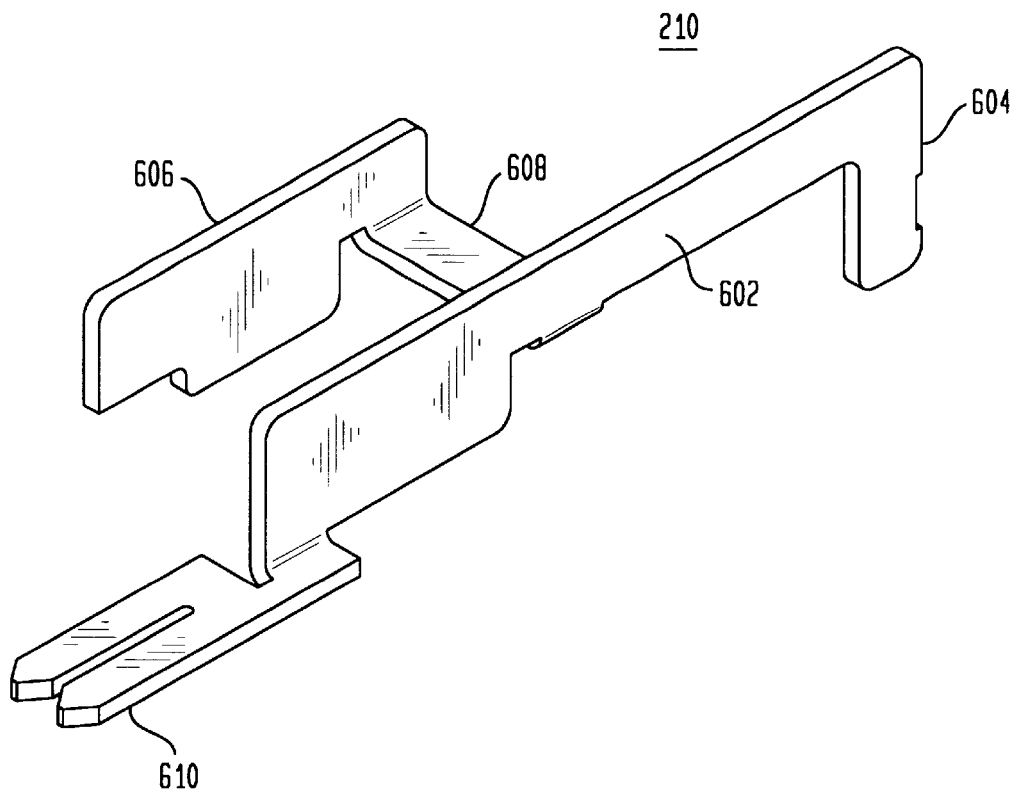
FIG. 6 shows a perspective view of one of the contacts of the patch plug of FIG. 2.

FIG. 6 shows a perspective view of one of the contacts 210 of FIG. 2. Each contact 210 has two stages. The first stage comprises the following structural components: a main transmission path 602 with a blade 604 at one end, an offset plate 606, and a bridge 608 connecting the offset plate 606 to the main transmission path 602. The second stage comprises an insulation displacing contact 610 connected at the other end of the main transmission path 602.

Figure 7:
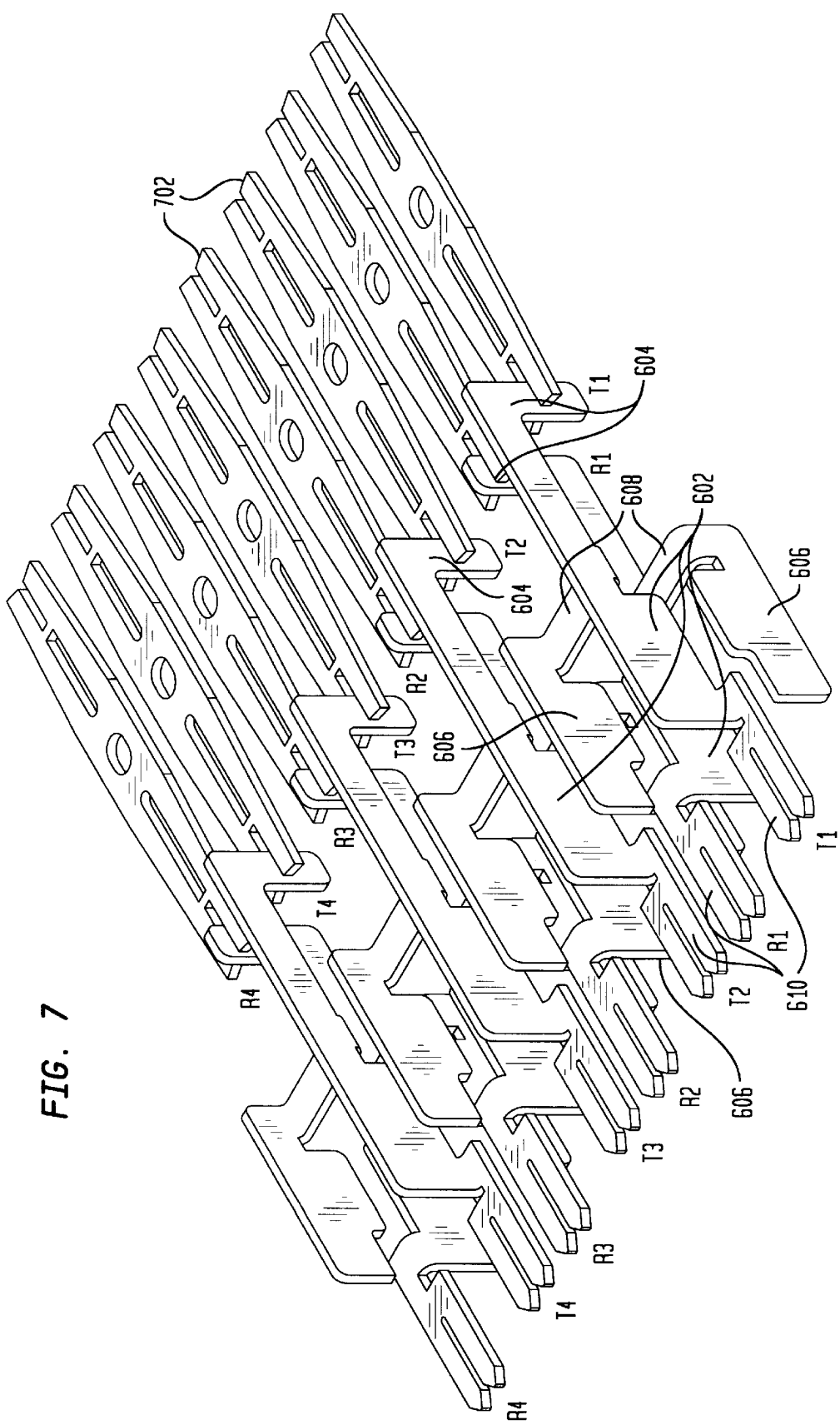
FIG. 7 shows a perspective view of the configuration of the eight contacts as assembled in the patch plug of FIGS. 2 and 3.

FIG. 7 shows a perspective view of the configuration of the eight contacts 210 as assembled in patch plug 200 of FIGS. 2 and 3. As such, FIG. 7 is analogous to the view of the configuration of contacts shown in FIGS. 1A–C for a prior-art 110-type patch plug. FIG. 7 also shows the configuration of the eight split-beam contacts 702 of a 110-type connecting block mated to patch plug 200, where the open ends of the split-beam contacts receive the blades 604 of the patch-plug contacts 210.

The proximity of the split-beam contacts within a 110-type connecting block for adjacent TIP-RING pairs leads to crosstalk induced in one TIP-RING pair from signals transmitted in an adjacent TIP-RING pair. For example, the proximity of the R1 split-beam contact to the T2 split-beam contact leads to crosstalk between the $1^{st}$ and $2^{nd}$ TIP-RING pairs. The patch-plug contacts of the present invention are designed to improve the level of crosstalk compensation for a patch plug mated with a 110-type connecting block.

As shown in FIG. 7, for each TIP-RING pair in patch plug 200, two contacts 210, having the exact same design, are placed next to one another with one rotated 180 degrees about its longitudinal axis with respect to the other. Under this configuration, for the $1^{st}$ TIP-RING pair (T1, R1), the following spatial relationships exist:

The main transmission path $602_{T1}$ for the TIP signal lies above the offset plate $606_{R1}$ for the RING signal;

The main transmission path $602_{R1}$ for the RING signal lies below the offset plate $606_{T1}$ for the TIP signal;

The bridge $608_{T1}$ for the TIP signal lies above the bridge $608_{R1}$ for the RING signal;

The blade $604_{T1}$ for the TIP signal is parallel to the blade $604_{R1}$ for the RING signal; and The IDC $610_{T1}$ for the TIP signal is aligned with the IDC $610_{R1}$ for the RING signal.

In addition, the following spatial relationships exist between the $1^{st}$ and $2^{nd}$ TIP-RING pairs:

The main transmission path $602_{R1}$ for the $1^{st}$ RING signal is adjacent to the offset plate $606_{R2}$ for the $2^{nd}$ RING signal;

The blade $604_{R1}$ for the $1^{st}$ RING signal is adjacent to the blade $604_{T2}$ for the $2^{nd}$ TIP signal;

The IDC $610_{R1}$ for the $1^{st}$ RING signal is adjacent to the IDC $610_{T2}$ for the $2^{nd}$ TIP signal; and The offset plate $606_{T1}$ for the $1^{st}$ TIP signal is adjacent to the main transmission path $602_{T2}$ for the $2^{nd}$ TIP signal.

Figure 8:
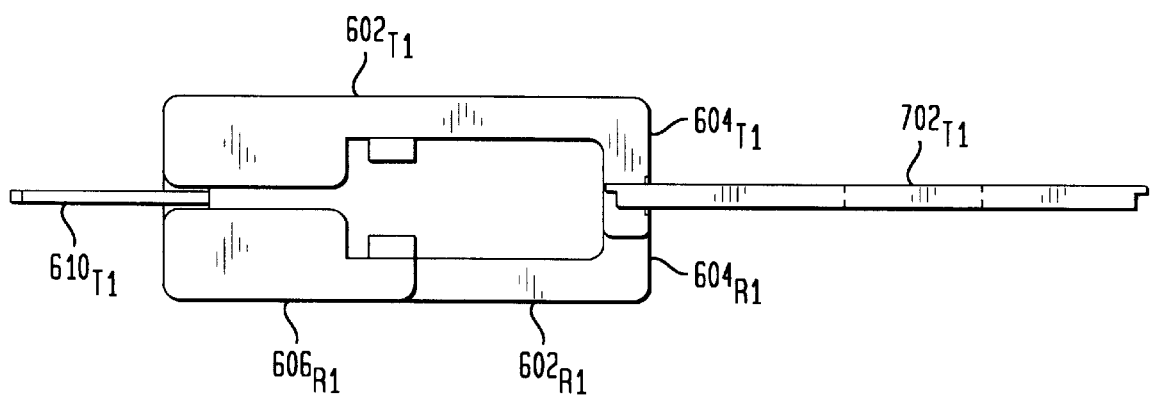
FIG. 8 shows a side view of the patch-plug and split-beam contacts of FIG. 7 as seen looking towards the $1^{st}$ TIP-RING pair.

FIG. 8 shows a side view of the patch-plug and split-beam contacts of FIG. 7 as seen looking towards the $1^{st}$ TIP-RING pair. As shown in FIG. 8, the main transmission paths 602 and blades 604 of each pair of TIP-RING contacts combine to form an electro-magnetic loop. For example, main transmission path $602_{T1}$ and blade $604_{T1}$ for the $1^{st}$ TIP signal combine with main transmission path $602_{R1}$ and blade $604_{R1}$ for the $1^{st}$ RING signal to form an electro-magnetic loop for the $1^{st}$ TIP-RING pair. The proximity of electro-magnetic loops for adjacent TIP-RING pairs results in inductive coupling between the pairs.

In addition, the structural components of the patch-plug contacts operate as capacitor plates with respect to adjacent structural components of other contacts. For example, as shown in FIG. 7, the offset plate $606_{T1}$ for the $1^{st}$ TIP-RING pair is adjacent to the main transmission path $602_{T2}$ for the $2^{nd}$ TIP-RING pair. These proximate structural components for adjacent TIP-RING pairs produce capacitive coupling between the pairs.

Figure 1B:
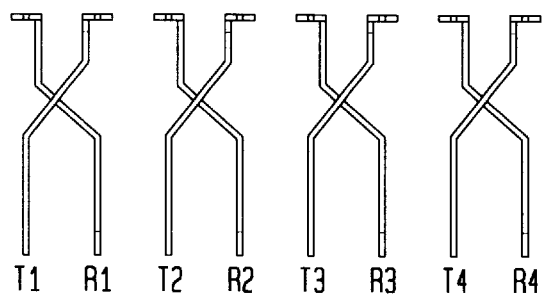
Figure 1C:

The design of contact 210 was selected to improve the compensation of crosstalk caused by the proximity of the split-beam contacts within a 110-type connecting block. One of the limitations of prior-art crosstalk compensation schemes, such as the inductive-coupling approach shown in FIGS. 1A–C, is that they do not take into account the fact that the compensation is applied at a different location along the signal path and therefore applied to the signal at a different time. As such, a phase difference exists between the crosstalk signal and the compensation signal designed to offset that crosstalk signal. The result is imperfect crosstalk compensation.

The contacts of the present invention, however, are designed to take into consideration both the magnitude of the original crosstalk as well as the phase differences between the original crosstalk and crosstalk signals generated along the contacts. In particular, the two stages of the contacts are designed such that the first stage induces a compensating signal (i.e., a signal that opposes the original crosstalk signal generated within the 110-type connecting block), while the second stage generates a counter-balancing signal (i.e., a signal that has the same polarity as the original crosstalk). The contacts are designed such that the magnitude of the compensating signal generated in the first stage is approximately the same as the magnitude of the sum of the original crosstalk signal from the 110-type connecting block and the counter-balancing signal generated in the second stage of the patch-plug contact.

Moreover, the locations of the compensating and counter-balancing crosstalk signals along the contacts are selected to take into account the phase differences between those signals and the original crosstalk signal. For example, in a particular embodiment in which (1) the counter-balancing signal induced in the second stage of the patch-plug contact has approximately the same magnitude as the original crosstalk signal and (2) the magnitude of the compensating signal induced in the first stage of the patch-plug contact is approximately twice the magnitude of the original crosstalk signal, the compensating signal is preferably located midway between the original crosstalk signal and the counter-balancing signal, where the location of the compensating signal is dictated by the position where the contact bridge (e.g., 608 in FIG. 6) joins the main transmission path (e.g., 602 in FIG. 6).

As such, the contacts of the present invention are designed to compensate for crosstalk generated within a 110-type connecting block, taking into account both the magnitude of the original crosstalk as well as the phase differences between the original crosstalk and the crosstalk-compensation signals generated within the patch-plug contacts.

Figure 9:
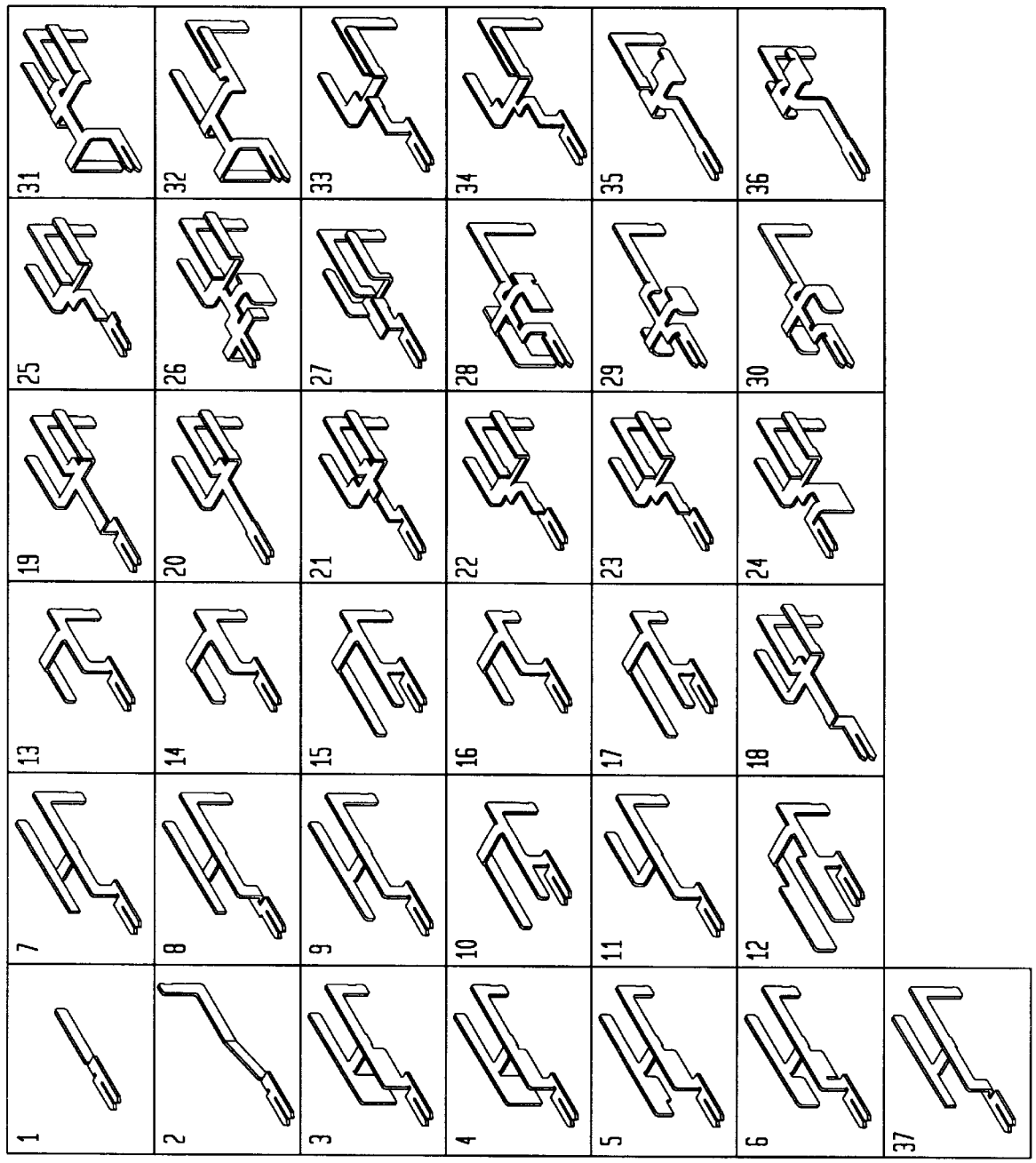
FIG. 9 shows perspective views of 37 different designs for contacts that can be used in the patch plug assembly of FIG. 2.

FIG. 9 shows perspective views of 37 different designs for contacts that can be used in the patch plug assembly of FIG. 2. Most of these contacts are designed to produce two stages of crosstalk compensation: a compensating first stage and a counter-balancing second stage. Depending on the particular design, the structural components of the compensating first stage of each contact may form both electromagnetic loops and capacitor plates that induce, respectively, inductive and capacitive coupling between TIP-RING pairs. The electromagnetic loops are formed by the relative positioning of the main transmission paths, offset plates, and blades within each TIP-RING pair. The capacitor plates are formed by the proximity of various structural components of adjacent contacts. The sizes, shapes, and locations of the structural components of each contact are selected taking into account the magnitudes of the original crosstalk signal, the compensating crosstalk signal, and the counter-balancing crosstalk signal.

The contact configurations of the present invention are designed to improve near-end crosstalk performance in 110-type patch plugs. Prior-art patch plugs are rated up to 100 MHz only, with a worst pair-to-pair near-end crosstalk loss of about 49 dB at 100 MHz when mated with a 110-type connecting block. The present invention can be used to achieve 55 dB worst pair-to-pair near-end crosstalk loss at 100 MHz and 49 dB at 200 MHz.

Prior-art crosstalk compensation schemes for electrical connectors introduce a canceling crosstalk signal of opposite polarity to the original crosstalk signal. The original crosstalk is typically linear with $\log_{10}$ frequency, thus exhibiting a magnitude vs. frequency slope of 20 dB/decade on a $\log_{10}$ frequency scale. If the canceling crosstalk were to occur at the exact location of the original crosstalk, the residual crosstalk from the difference between the original and canceling crosstalk magnitudes would also be linear with $\log_{10}$ frequency, thus also exhibiting a 20 dB/decade slope.

Because of physical constraints, however, the canceling crosstalk cannot be introduced at the exact location of the original crosstalk. Rather, the canceling crosstalk is introduced at a certain distance from the original crosstalk, resulting in a delay before the canceling crosstalk arrives at the site of the original crosstalk. This delay is dictated by the electrical length between the sites at which these two crosstalk signals take place. The effect of this time delay can be understood based on the following analysis.

The resultant crosstalk $\overline{X}_R$ is defined by Equation (1) as follows:

$$\overline{X}_R = -j\omega_0 X_1 - X_2 e^{-j\omega Del} \qquad (1)$$

where $\omega$ is the angular frequency, $\omega X_1$ is the magnitude of the original crosstalk, $\omega X_2$ is the magnitude of the compensating crosstalk, and Del is the round-trip time delay between the original crosstalk and the compensating crosstalk.

Equation (1) can be rewritten as Equation (2) as follows:

$$\overline{X}_R = -j\omega_0 X_1 - X_2 \cos\omega Del + jX_2 \sin\omega Del \qquad (2)$$

Assuming $\omega$Del much less than one, Taylor expansion approximations can be used to rewrite Equation (2) as follows:

$$\overline{X}_R = -j\omega\left(X_1 - X_2 + \frac{1}{2}X_2\omega^2 Del^2 + jX_2\omega Del\right) \quad (3)$$

and $$|X_R| = \omega\sqrt{\left(X_1 - X_2 + \frac{1}{2}X_2\omega^2 Del^2 + jX_2\omega Del\right)^2} \quad (4)$$

It can be seen from Equation (4) that the magnitude of the resultant crosstalk $|X_R|$ increases as frequency increases and that perfect cancellation is not possible across a frequency range even if $X_2$ was made exactly equal to $X_1$. For values of $\omega Del$ much less than one, the resultant crosstalk is a linear function of frequency. As $\omega Del$ become larger (i.e., with increasing frequency), the non-linear terms in Equations (3) and (4) begin to dominate until, for relatively large frequency values, the resultant crosstalk becomes essentially a function of the square of the frequency. In general, when expressed in dB, the slope of a curve representing crosstalk as a function of frequency would be N×20 dB/decade, where N is the order of the equation relating frequency to crosstalk. Thus, if $X_1$ were equal to $X_2$, the resultant crosstalk would be a function of the square of the frequency, causing the slope to be 40 dB/decade. If $X_1$ and $X_2$ were not equal, then the slope increases with frequency, starting at 20 dB/decade for low frequencies and ending at 40 dB/decade for high frequencies. Thus, while acceptable crosstalk levels may be achieved at low frequencies (e.g., 100 MHz) with this approach, these levels are bound by the delay to and from the compensating crosstalk, and the crosstalk levels at high frequencies (e.g., 200 MHz) would not be acceptable, because of the steep slope.

The present invention uses a two-stage, counter-balanced crosstalk compensation scheme to achieve low crosstalk levels. According to one implementation of this scheme, at a delay (Del), a canceling crosstalk opposite in polarity and twice in magnitude relative to the original crosstalk is introduced, and, at twice that delay (2Del), a non-canceling (i.e., counter-balancing) crosstalk with same polarity and magnitude relative to the original crosstalk is introduced. The behavior of this scheme can be understood from the following analysis. Patch plugs of the present invention are based on this crosstalk compensation scheme.

In this case, the resultant crosstalk $\overline{X}_R$ is given by Equation (5) as follows:

$$\overline{X}_R = -j\omega_0 X_1 - 2X_2 e^{-j\omega Del} + X_2 e^{-j\omega(2Del)} \quad (5)$$

where $\omega$ is the angular frequency, $\omega X_1$ is the magnitude of the original crosstalk, $2\omega X_2$ is the magnitude of the compensating crosstalk, Del is the round-trip time delay between the original crosstalk and the compensating crosstalk, $\omega X_2$ is the magnitude of the counter-balancing crosstalk, and 2Del is the round-trip time delay between the original crosstalk and the counter-balancing crosstalk.

Equation (5) can be rewritten as Equation (6) as follows:

$$\overline{X}_R = -j\omega_0 X_1 - 2X_2 \cos\omega Del + \quad (6)$$
$$2jX_2\sin\omega Del + X_2\cos 2\omega Del - jX_2\sin 2\omega Del$$

Equation (6) can be rewritten as Equation (7) as follows:

$$\overline{X}_R = j\omega_0 X_1 - 2X_2\cos\omega Del + 2jX_2\sin\omega Del + \quad (7)$$
$$X_2\cos^2\omega Del - X_2\sin^2\omega Del - 2jX_2\sin\omega Del\cos\omega Del$$

Assuming very small $\omega Del$, Taylor expansion approximations can be used to rewrite Equation (7) as follows:

$$X_R = j\omega_0 X_1 - 2X_2 + X_2\omega^2 Del^2 + 2jX_2\omega Del + \quad (8)$$
$$X_2 - X_2\omega^2 Del^2 - X_2\omega^2 Del^2 - 2jX_2\omega Del$$

$$X_R = -j\omega_0 X_1 - X_2 - X_2\omega^2 Del^2 \quad (9)$$

and $$|X_R| = \omega|X_1 - X_2 - X_2\omega^2 Del^2| \quad (10)$$

It can be seen from Equation (10) that this scheme improves the resultant crosstalk level as compared to the prior-art scheme of Equation (4) for $X_2$ equal to $X_1$ and $\omega Del$ much less than one. It can also be seen that the resultant crosstalk $\overline{X}_R$ is a function of the cube of the frequency $\omega$, if $X_1$ was equal to $X_2$, causing the slope to be 60 dB/decade. If $X_2$ is less than $X_1$, a resonance occurs at $X_1-X_2=X_2\omega^2 Del^2$, and, if $X_2$ is greater than $X_1$, then the slope increases with frequency starting at 20 dB/decade at low frequencies and ending at 60 dB/decade at high frequencies. Thus, crosstalk levels can be made substantially better than the previous scheme by making $X_2$ less than $X_1$, thus placing the null point at an advantageous frequency.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A connector for cordage having two or more balanced signal-transmission pairs, comprising a pair of contacts for each balanced signal-transmission pair, wherein the contacts are configured to reduce an original crosstalk signal generated when the connector is mated to a receptacle, wherein each contact comprises a first set of structural components adapted to provide a first stage of crosstalk compensation and a second set of structural components adapted to provide a second stage of crosstalk compensation, wherein the first set of structural components generates a compensating crosstalk signal that opposes the original crosstalk signal and the second set of structural components generates a counter-balancing crosstalk signal that opposes the compensating crosstalk signal.

2. The connector of claim 1, wherein the first set of structural components is located between the receptacle and the second set of structural components to take into account phase differences between the original crosstalk signal, the compensating crosstalk signal, and the counter-balancing crosstalk signal.

3. The connector of claim 1, wherein the magnitude of the compensating crosstalk signal is approximately equal to the magnitude of the sum of the original crosstalk signal and the counterbalancing crosstalk signal.

4. The connector of claim 1, wherein the pair of contacts for each balanced signal-transmission pair are configured with one contact rotated 180 degrees about a longitudinal axis with respect to the other contact.

5. The connector of claim 1, wherein each contact has the same design.

6. The connector of claim 1, wherein the first and second sets of structural components provide compensation for reducing common-mode signals generated by unequal coupling.

7. The connector of claim 1, wherein the first set of structural components of each contact comprises:

(a) a main transmission path;

(b) a blade at one end of the main transmission path and adapted to engage a contact of the receptacle;

(c) an offset plate; and (d) a bridge connecting the offset plate to the main transmission path; and the second set of structural components of each contact comprises an insulation displacement contact (IDC) at another end of the main transmission path and adapted to terminate a wire of a balance signal-transmission pair.

8. The connector of claim 1, wherein the first stage generates both inductive and capacitive coupling between balanced signal-transmission pairs.

9. The connector of claim 1, wherein the connector is a 110-type patch plug and the receptacle is a 110-type connecting block with split-beam contacts.

10. The connector of claim 1, wherein the distance between the structural components of the second set for contacts corresponding to the same balanced signal-transmission pair is greater than the distance between the structural components of the second set for adjacent contacts corresponding to two different balanced signal-transmission pairs.

11. The connector of claim 7, wherein the position of the bridge is selected taking into account phase differences between the original crosstalk signal, the compensating crosstalk signal, and the counter-balancing crosstalk signal.

12. The connector of claim 7, wherein the sizes, shapes, and locations of the structural components of each contact are selected taking into account the magnitudes of the original crosstalk signal, the compensating crosstalk signal, and the counter-balancing crosstalk signal.

13. The connector of claim 7, wherein the main transmission paths and blades of the contacts form electro-magnetic loops for inductive coupling between balanced signal-transmission pairs and the structural components of the contacts operate as capacitor plates for capacitive coupling between balanced signal-transmission pairs.

* * * * *

UNITED STATES PATENT AND TRADEMARK OFFICE
CERTIFICATE OF CORRECTION

PATENT NO. : 5,915,989
DATED : June 29, 1999
INVENTOR(S) : Lu W. Adriaenssens, et. al.

It is certified that error appears in the above-identified patent and that said Letters Patent is hereby corrected as shown below:

Title page, item [54] and col. 1, line 2, delete "Crosswalk" and insert-- Crosstalk--.

Signed and Sealed this

Thirtieth Day of November, 1999

Attest:

Q. TODD DICKINSON

Attesting Officer

Acting Commissioner of Patents and Trademarks